Figure 1:
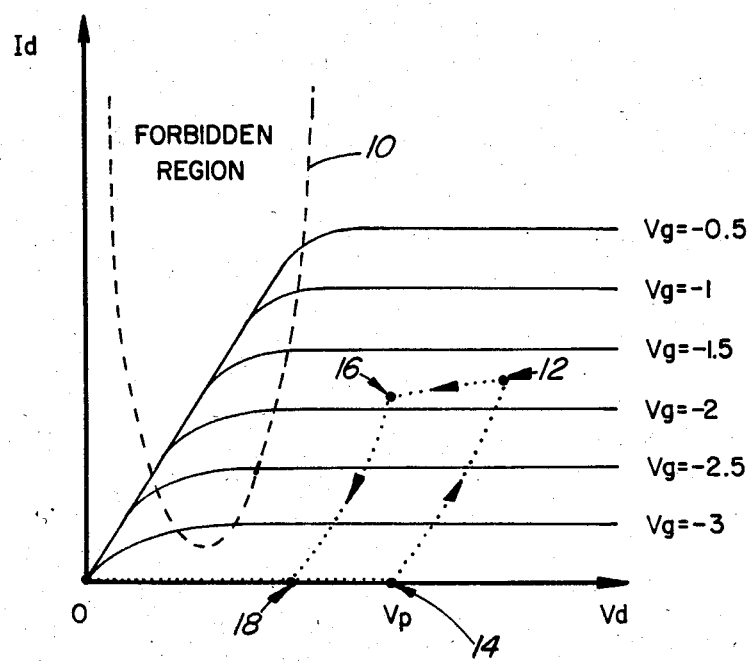

United States Patent [19]

Conn

[11] Patent Number: 4,605,866

[45] Date of Patent: Aug. 12, 1986

[54] D.C. BIASSING OF MESFETS TO PREVENT OSCILLATION DURING POWER SUPPLY SWITCHING

[75] Inventor: David R. Conn, Nepean, Canada

[73] Assignee: Northern Telecom Limited, Montreal, Canada

[21] Appl. No.: 598,715

[22] Filed: Apr. 11, 1984

[51] Int. Cl.[4] .............................................. G01R 19/165
[52] U.S. Cl. ............................ 307/296 R; 307/200 B; 307/297; 307/491; 307/363; 307/544; 307/591; 361/86; 361/92
[58] Field of Search ............ 307/200 B, 491, 493–495, 307/497, 362, 363, 542, 544, 570, 591–592, 605, 296 R, 297; 323/311–312; 361/86, 88, 92

[56] References Cited

U.S. PATENT DOCUMENTS

| | | | |
|---|---|---|---|
| 4,254,347 | 3/1981 | Ray | 307/297 |
| 4,290,005 | 9/1981 | Arumugham | 307/297 X |
| 4,322,634 | 3/1982 | Kaire et al. | 307/296 R X |
| 4,428,020 | 1/1984 | Blanchard, Jr. | 361/88 X |
| 4,434,378 | 2/1984 | Ballentine, Jr. | 307/296 R X |
| 4,449,067 | 5/1984 | Nishikawa | 307/570 |
| 4,493,000 | 1/1985 | Edwards | 361/86 X |
| 4,510,549 | 4/1985 | Tedesco | 361/86 |

*Primary Examiner*—Stanley D. Miller
*Assistant Examiner*—D. R. Hudspeth
*Attorney, Agent, or Firm*—R. John Haley

[57] ABSTRACT

Current in the drain-source path of a microwave high-power GaAs MESFET is controlled by a regulating circuit including an integrating differential amplifier whose output controls the gate of the MESFET. One input of the differential amplifier is supplied with a fraction of the supply voltage, and the other is supplied with a voltage dependent upon the current to be controlled. During switch-on and switch-off of the supply voltage, the risk of Gunn effect oscillation of the MESFET is avoided by a switching circuit which controls the differential amplifier to maintain substantially zero drain-source current when the supply voltage is below a predetermined level less than its nominal level.

10 Claims, 2 Drawing Figures

D.C. BIASSING OF MESFETS TO PREVENT OSCILLATION DURING POWER SUPPLY SWITCHING

This invention relates to the d.c. biassing of MESFETs (metal semiconductor field effect transistors) which are operated at high frequencies, for example microwave frequencies.

In radio transmission systems operating at microwave frequencies of for example 4 GHz and above, it is known to use GaAs (gallium arsenide) MESFETs to handle the high frequency and relatively high power signals involved. As is known by their use in Gunn effect oscillators, GaAs semiconductors exhibit a negative resistance region at electric fields of the order of 3000 V/cm, corresponding to a potential difference of about 0.3 V across the active range length of about 1 micrometer of a MESFET. Whilst such a potential difference is easily exceeded in normal operation of MESFETs in a microwave radio transmission system power amplifier, it can occur during switch-on and switch-off of power to the amplifier, leading to undesired oscillation and consequent possible destruction or shortened life of the MESFETs. This is a serious concern in view of the considerable expense of high power high frequency MESFETs and the need to ensure reliable operation of the transmission system.

An object of this invention, therefore, is to provide a biassing circuit for a high frequency MESFET which enables the undesired oscillation described above to be substantially eliminated.

According to this invention there is provided a d.c. biassing circuit for a MESFET having a gate and a controlled path including a drain and a source, comprising: means connected to the controlled path for deriving current therefor from a supply voltage; regulating means connected to the gate of the MESFET for controlling the gate to regulate the current in the controlled path; and switching means responsive to the supply voltage being below a predetermined level for controlling the regulating means to limit the current in the controlled path.

Thus in accordance with the invention current in a controlled path of the MESFET is limited, for example to substantially zero, when the supply voltage is below a predetermined level below which oscillation could otherwise occur. As described below, this removes the risk of oscillation during switch-on and switch-off of power.

Preferably the means for deriving current comprises a resistor for controlling the gate in series between the controlled path and the supply voltage. Advantageously the regulating means comprises means for producing a first potential from the supply voltage; means for producing a second potential from the supply voltage minus the voltage dropped across said resistor by the current in the controlled path flowing through said resistor, and differential amplifier means responsive to the first and second potentials for controlling the gate of the MESFET in response to differences between said potentials. The means for producing the first and second potentials conveniently comprise voltage dividers, and the differential amplifier means preferably comprises an integrator.

The switching means preferably comprises a transistor stage having an output coupled to an input of the differential amplifier means; and means for causing said transistor stage to conduct current when the supply voltage is below said predetermined level thereby to cause the differential amplifier means to control the gate of the MESFET to reduce the current in the controlled path to substantially zero, said means causing said transistor stage to be non-conductive when the supply voltage is above said predetermined level.

Preferably the means for causing said transistor stage to be conductive or non-conductive comprises a further transistor stage coupled to the first-mentioned transistor stage, and potential divider means including a Zener diode for biassing the further transistor stage to conduct or not conduct current when the supply voltage is respectively above or below the predetermined level. The output of the transistor stage is preferably coupled to the input of the differential amplifier means via a diode poled to be forward biassed when the transistor stage conducts current.

The invention also extends to a method of preventing oscillation of a high frequency MESFET during switch-on and switch-off of power to the MESFET, comprising the steps of: determining when a supply voltage, from which current in a controlled path of the MESFET is derived, is below a predetermined level less than its nominal level, and, in response to such determination, controlling the MESFET to maintain substantially zero current in the controlled path.

Figure 2:
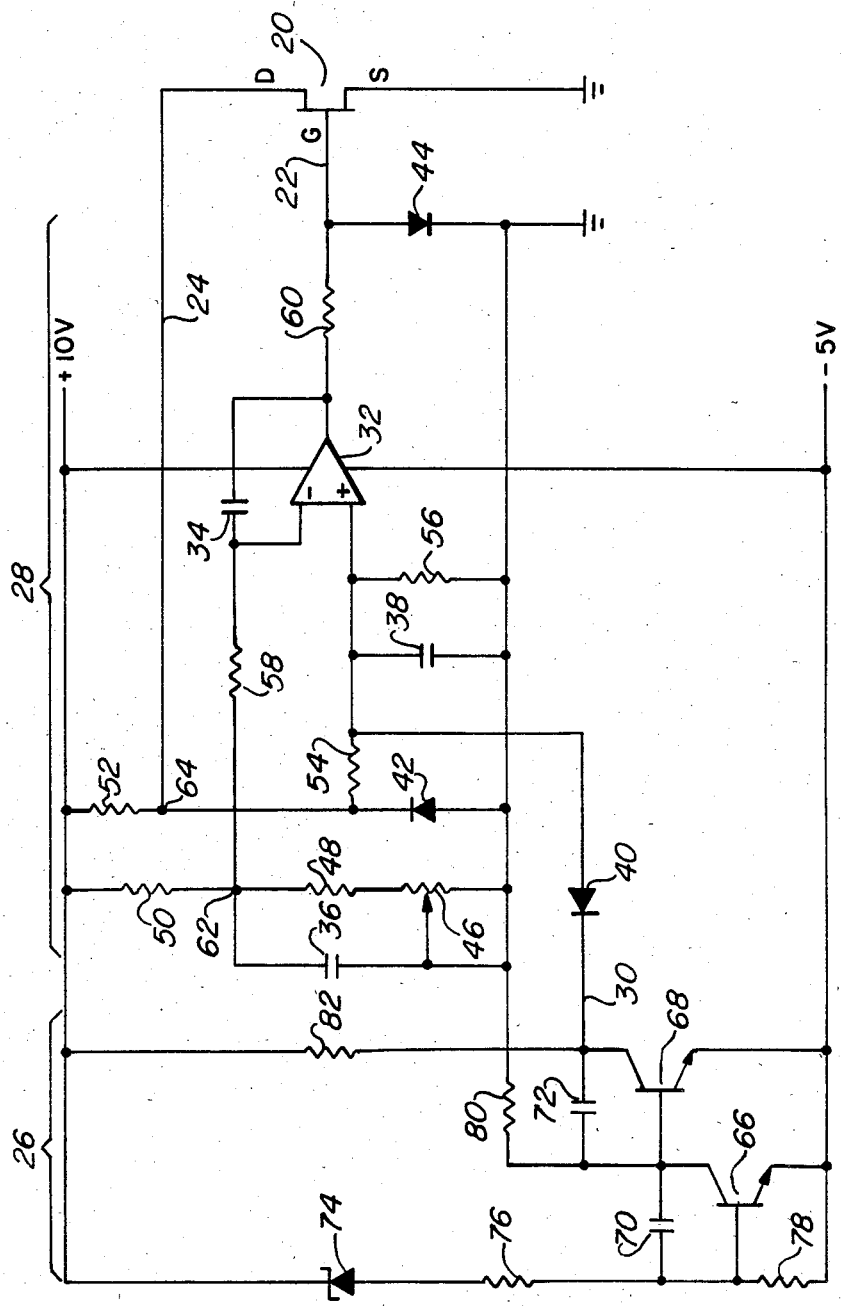

The invention will be further understood from the following description with reference to the accompanying drawings, in which:

FIG. 1 illustrates characteristics of a MESFET and its biassing in accordance with the invention; and FIG. 2 schematically illustrates a MESFET biassing circuit in accordance with the invention.

Referring to the drawings, FIG. 1 illustrates in solid lines for various gate voltages Vg the drain current Id as a function of the drain voltage Vd of a GaAs MESFET having its source grounded. A dashed line 10 indicates the boundary of a region within which Gunn effect oscillations, which are potentially damaging to the MESFET, can occur. This region is referred to in FIG. 1 as a forbidden region, operation within which is to be avoided in all circumstances.

A point 0 in FIG. 1 denotes the origin of the graph, at which drain current and voltage are both zero, and a point 12 denotes a typical normal desired operating point of the MESFET. The point 12 is well outside the forbidden region so that there is no risk of damaging oscillations during normal operation. However, on switching on and off power supplies to the MESFET, the operating point of the MESFET moves between the points 0 and 12, generally passing through the forbidden region and producing a risk of damage to the MESFET due to oscillation.

In accordance with the invention, passage of the MESFET operating point through the forbidden region is avoided by causing the operating point to follow a path shown by dotted lines in FIG. 1. During switch-on, the operating point moves from the origin 0 to a point 14 corresponding to a predetermined drain voltage Vp and a very low, virtually zero, drain current, and thence to the normal operating point 12. During switch-off, the operating point follows a normal path from the operating point 12 to a point 16 corresponding to the predetermined drain voltage Vp. The drain current Id is then reduced rapidly to a very low, virtually zero, level at a point 18, from which the operating point moves to the origin 0.

Thus during both switch-on and switch-off, as well as in normal operation, the operating point of the MESFET is kept well clear of the forbidden region, so that Gunn effect oscillations can not occur. The manner in which this is achieved is described below with reference to the circuit illustrated in FIG. 2.

FIG. 2 illustrates a GaAs microwave MESFET 20 having a gate G, a drain D, and a source S which is grounded. The MESFET 20 serves to amplify radio frequency (r.f.) signals in a power amplifier of a radio transmission system. As the invention is concerned only with the d.c. biassing of the MESFET 20, r.f. circuitry associated with the MESFET 20, in particular for supplying signals to the gate G and deriving signals from the drain D, is not shown for the sake of simplicity and clarity. It should be understood, however, that such circuitry is provided in known manner. Furthermore, it is observed that the MESFET 20 may be connected via relatively long paths 22 and 24 to the gate G and drain D respectively, whereby the MESFET 20 can be conveniently arranged for handling the r.f. signals while the remainder of the circuit shown in Fig. 2 can be relatively isolated from the r.f. signals.

The biassing circuit itself consists of two parts, referred to here as being a switching circuit 26 and a regulating circuit 28, which are powered by common +10 Volt and −5 Volt, relative to ground, power supplies. An output 30 of the switching circuit 26 controls the regulating circuit 28 as described below. The regulating circuit 28 is associated with the specific MESFET 20 illustrated in FIG. 2; other MESFETs in the radio transmission system power amplifier may similarly be associated with respective other regulating circuits. In this case all of the regulating circuits can be commonly controlled by the one switching circuit 26 illustrated in FIG. 2.

The regulating circuit 28 comprises an integrator formed by a differential amplifier 32 and a negative feedback capacitor 34, smoothing capacitors 36 and 38, diodes 40, 42, and 44, a variable resistor 46, and fixed-value resistors 48, 50, 52, 54, 56, 58, and 60.

The resistors 46, 48, and 50 form a potential divider across the +10 Volt supply to produce a predetermined potential of for example 5 Volts at a junction point 62. This potential is smoothed by the capacitor 36 and coupled to the inverting input of the amplifier 32 via the resistor 58, which together with the capacitance of the capacitor 34 determines the time constant of the integrator.

The drain current of the MESFET 20 is supplied from the +10 Volt supply via the resistor 52, to produce at a junction point 64 a voltage which is dependent upon the drain current. This voltage is reduced by a potential divider formed by the resistors 54 and 56 to produce a resultant voltage which is smoothed by the capacitor 38 and applied to the non-inverting input of the amplifier 32. The amplifier integrates any difference between the voltages applied to its inputs to produce at its output a control voltage for the gate G of the MESFET 20, this voltage being applied to the gate G via the resistor 60 which serves to limit gate current.

The diodes 42 and 44 are connected between the drain and source and between the gate and source, respectively, of the MESFET 20 in order to prevent reverse voltages being applied to the MESFET. In normal operation about the operating point 12 in FIG. 1 these diodes have no effect. Similarly, in normal operation about the operating point 12 the output 30 of the switching circuit 26 is at substantially +10 Volts as described below, so that the diode 40 is reverse biassed and has no effect.

In normal operation, the regulating circuit 28 serves to maintain the drain current of the MESFET 20 at a predetermined value, which can be adjusted by means of the variable resistor 46. Any change in drain current produces an oppositely-directed change in the voltage at the junction point 64, and hence at the non-inverting input of the amplifier 32 and hence in the gate current of the MESFET 20 to correct the change in the drain current.

The switching circuit 26 comprises bipolar transistors 66 and 68, transient-suppressing capacitors 70 and 72 connected between the collectors and bases of these transistors, a 10 Volt Zener diode 74, and resistors 76, 78, 80, and 82. The Zener diode 74 is connected to the +10 Volt supply and in series with a potential divider to the −5 Volt supply, the potential divider being formed by the resistors 76 and 78 and having its junction point connected to the base of the transistor 66. The transistor 66 has its emitter connected to the −5 Volt supply and its collector connected to the base of the transistor 68 and via the resistor 80 to ground. The transistor 68 has its emitter connected to the −5 Volt supply and its collector connected to the output 30 and via the resistor 82 to the +10 Volt supply.

During normal operation, the voltage produced by the Zener diode 74 and resistors 76 and 78 at the base of the transistor 66 is sufficient to turn this transistor fully on, consequently turning off the transistor 68 so that its collector, and hence the output 30, is at the +10 Volt supply potential. As already explained above, in this situation the switching circuit 26 has no effect on the regulating circuit 28.

The switching circuit 26 controls the regulating circuit 28 during switch-on and switch-off of the supply voltages in the manner described below. The supplies are arranged in any desired known manner, for example using mechanical or electronic switches, so that the −5 Volt supply is always turned on and stabilized before, and is turned off after, the +10 Volt supply.

During switch-on, with the −5 Volt supply connected and before the +10 Volt supply is connected, the Zener diode 74 prevents conduction of the transistor 66, and the transistor 68 conducts by virtue of base current being supplied via the resistor 80. Consequently the collector of the transistor 68, and hence the output 30 of the switching circuit, has a potential close to the −5 Volt supply. In consequence the diode 40 is forward biassed, and the potential at the non-inverting input of the amplifier 32 is held at a low level of about −4 Volts. In consequence the output of the amplifier 32 becomes about −5 Volts so that little or no drain current Id can flow in the MESFET 20.

On connection of the +10 Volt supply, as this supply voltage increases from zero to ten volts the above situation is initially unchanged, so that the drain current Id of the MESFET 20 remains at or near zero. This corresponds to the dotted line between the points 0 and 4 in FIG. 1. When the +10 Volt supply reaches a potential of about +6 Volts, corresponding to the voltage Vp in FIG. 1, the voltage at the junction point between the resistors 76 and 78 reaches a level sufficient to start turning on the transistor 66, whereby its collector voltage falls (becomes more negative), the transistor 68 is turned off, and the voltage at the output 30 rises, allowing the amplifier 32 to control the gate G of the MES- FET 20 so that the drain current Id increases from zero. This corresponds to the dotted line from the point 14 to the point 12 in FIG. 1.

On switch-off, initially the drain current Id of the MESFET 20 falls only slightly (dotted line from the point 12 to the point 16 in FIG. 1), until the +10 Volt supply reaches the voltage Vp of about +6 Volts, whereupon the transistors 66 and 68 change state and the drain current Id is rapidly reduced to zero (dotted line from the point 16 to the point 18 in FIG. 1) for the reasons already explaiCned above, the drain current Id remaining at or near zero as the +10 Volt supply voltage is further reduced to zero.

By way of further explanation, it is observed that the various components of the biassing circuit illustrated in FIG. 2 may have the following values:

| Reference | Value |
|---|---|
| 34 | 47 nF |
| 36, 38 | 100 nF |
| 46 | 1 kilohm (variable) |
| 48 | 4.3 kilohms |
| 50, 54, 56 | 5.1 kilohms |
| 52 | 0.5 ohms |
| 58 | 10 kilohms |
| 60 | 301 ohms |
| 70, 72 | 1 nF |
| 76, 78 | 20 kilohms |
| 80 | 3 kilohms |
| 82 | 100 kilohms |

Although a particular embodiment of the invention has been described in detail, it should be understood that numerous modifications, variations, and adaptations may be made thereto without departing from the scope of the invention, which is defined by the claims.

What is claimed is:

1. A d.c. biassing circuit for a MESFET having a gate and a controlled path including a drain and a source, comprising:
    means connected to the controlled path for deriving current therefor from a supply voltage:
    regulating means connected to the gate of the MESFET for controlling the gate to regulate the current in the controlled path; and
    switching means responsive to the supply voltage being below a predetermined level for controlling the regulating means to limit the current in the controlled path.

2. A circuit as claimed in claim 1 wherein the means for deriving current comprises a resistor connected in series between the controlled path and the supply voltage.

3. A circuit as claimed in claim 2 wherein the regulating means comprises amplifier means responsive to the current in the controlled path flowing through said resistor to control the gate of the MESFET to regulate the current.

4. A circuit as claimed in claim 2 wherein the regulating means comprises:
    means for producing a first potential from the supply voltage;
    means for producing a second potential from the supply voltage minus the voltage dropped across said resistor by the current in the controlled path flowing through said resistor; and
    differential amplifier means responsive to the first and second potentials for controlling the gate of the MESFET in response to differences between said potentials.

5. A circuit as claimed in claim 4 wherein the means for producing the first and second potentials comprise voltage dividers.

6. A circuit as claimed in claim 4 wherein the differential amplifier means comprises an integrator.

7. A circuit as claimed in claim 4 wherein the switching means comprises:
    a transistor stage having an output coupled to an input of the differential amplifier means; and
    means for causing said transistor stage to conduct current when the supply voltage is below said predetermined level thereby to cause the differential amplifier means to control the gate of the MESFET to reduce the current in the controlled path to substantially zero, said means causing said transistor stage to be non-conductive when the supply voltage is above said predetermined level.

8. A circuit as claimed in claim 7 wherein the means for causing said transistor stage to be conductive or non-conductive comprises a further transistor stage coupled to the first-mentioned transistor stage, and potential divider means including a Zener diode for biassing the further transistor stage to conduct or not conduct current when the supply voltage is respectively above or below the predetermined level.

9. A circuit as claimed in claim 7 wherein the output of the transistor stage is coupled to the input of the differential amplifier means via a diode poled to be forward biassed when the transistor stage conducts current.

10. A method of preventing oscillation of a high frequency MESFET during switch-on and switch-off of power to the MESFET, comprising the steps of: determining when a supply voltage, from which current in a controlled path of the MESFET is derived, is below a predeterminied level less than its nominal level; and, in response to such determination, controlling the MESFET to maintain substantially zero current in the controlled path.

* * * * *